(12) United States Patent
Heanue et al.

(10) Patent No.: US 6,850,475 B1
(45) Date of Patent: Feb. 1, 2005

(54) SINGLE FREQUENCY LASER SOURCE FOR OPTICAL DATA STORAGE SYSTEM

(75) Inventors: John F. Heanue, Fremont, CA (US); Jerry E. Hurst, Jr., San Jose, CA (US); Jeffrey P. Wilde, Los Gatos, CA (US)

(73) Assignee: Seagate Technology, LLC, Scotts Valley, CA (US)

( * ) Notice: Subject to any disclaimer, the term of this patent is extended or adjusted under 35 U.S.C. 154(b) by 0 days.

(21) Appl. No.: 08/883,320

(22) Filed: Jun. 26, 1997

Related U.S. Application Data

(63) Continuation-in-part of application No. 08/823,422, filed on Mar. 24, 1997, now abandoned.
(60) Provisional application No. 60/025,801, filed on Aug. 27, 1996, provisional application No. 60/023,476, filed on Aug. 6, 1996, and provisional application No. 60/022,775, filed on Jul. 30, 1996.

(51) Int. Cl.[7] .................................................. G11B 7/00
(52) U.S. Cl. .................................. 369/112.01; 369/119
(58) Field of Search ............................. 369/112, 110, 369/120, 44.23, 44.24, 44.12, 118, 119

(56) References Cited

U.S. PATENT DOCUMENTS

| | | | |
|---|---|---|---|
| 3,737,236 A | 6/1973 | Borrelli | 356/118 |
| 4,003,059 A | 1/1977 | Sugiura et al. | 346/108 |
| 4,135,083 A | 1/1979 | Van Alem et al. | 250/201 |
| 4,298,245 A | 11/1981 | Aulich et al. | 350/96.29 |
| 4,337,531 A | 6/1982 | Willemsen | 369/45 |
| 4,449,204 A * | 5/1984 | Shimada et al. | 369/110 |
| 4,510,544 A | 4/1985 | Lazzari | 360/114 |
| 4,532,619 A * | 7/1985 | Sugiyama et al. | 369/110 |
| 4,539,519 A | 9/1985 | Ulrich et al. | 324/117 |
| 4,581,529 A | 4/1986 | Gordon | 250/227 |
| 4,609,871 A | 9/1986 | Bobb | 324/244 |
| 4,626,679 A | 12/1986 | Kuwayama et al. | 250/227 |
| 4,683,421 A | 7/1987 | Miller et al. | 324/96 |
| 4,740,951 A | 4/1988 | Lizet et al. | 370/3 |
| 4,796,226 A | 1/1989 | Valette | 365/122 |
| 4,799,210 A | 1/1989 | Wilson et al. | 369/110 |
| 4,806,885 A | 2/1989 | Morimoto | 332/7.51 |
| 4,847,823 A | 7/1989 | Lindow et al. | 369/110 |
| 4,866,372 A | 9/1989 | Aoshima et al. | 324/96 |
| 4,945,400 A | 7/1990 | Blonder et al. | 357/74 |
| 4,978,187 A * | 12/1990 | Minemura et al. | 369/53 |

(List continued on next page.)

FOREIGN PATENT DOCUMENTS

| | | |
|---|---|---|
| EP | 0331331 A2 | 9/1989 |
| EP | 0460890 A2 | 6/1990 |
| EP | 0614101 A2 | 9/1994 |
| EP | 0650133 A2 | 4/1995 |
| EP | 0712121 A2 | 5/1996 |
| GB | 2016744 A | 9/1979 |
| JP | 59-117180 | 6/1984 |
| WO | WO 95/13638 | 5/1995 |

OTHER PUBLICATIONS

R. Boysel, T. McDonald, G. Magel, G. Smith, J. Leonard, "Integration of Deformable Mirror Devices with Optical Fibers and Waveguides", *SPIE*, vol. 1793, Integrated Optics and Microstructures (1992), pp. 34–39.

(List continued on next page.)

*Primary Examiner*—Nabil Hindi
(74) *Attorney, Agent, or Firm*—Moser, Patterson & Sheridan, LLP.

(57) ABSTRACT

An optical data storage system utilizes optical fibers for transfer of information to and from storage media. The storage media includes magneto-optical storage disks. The optical fibers are single-mode polarization maintaining optical fibers. A single frequency laser diode provides a source of polarized light. Accordingly, a polarization state conveyed by the polarization maintaining optical fiber is accurately reproduced with reduced noise, as compared to use of a Fabry-Perot laser diode.

14 Claims, 8 Drawing Sheets

U.S. PATENT DOCUMENTS

| | | | | |
|---|---|---|---|---|
| 5,029,023 A | * | 7/1991 | Bearden et al. | 369/33 |
| 5,033,043 A | | 7/1991 | Hayakawa | 369/121 |
| 5,034,679 A | | 7/1991 | Henderson et al. | 324/96 |
| 5,039,220 A | | 8/1991 | Arditty et al. | 356/345 |
| 5,111,326 A | * | 5/1992 | Ball | 369/110 |
| 5,119,361 A | | 6/1992 | Tanabe | 369/121 |
| 5,124,961 A | | 6/1992 | Yamaguchi et al. | 369/13 |
| 5,135,295 A | | 8/1992 | Jen et al. | 385/13 |
| 5,137,359 A | | 8/1992 | Steele | 356/350 |
| 5,152,597 A | | 10/1992 | Barnard | 359/130 |
| 5,164,956 A | | 11/1992 | Lang | 372/96 |
| 5,191,387 A | | 3/1993 | Ichikawa et al. | 356/34 |
| 5,199,090 A | | 3/1993 | Bell | 385/33 |
| 5,212,583 A | | 5/1993 | Vali et al. | 359/245 |
| 5,218,582 A | | 6/1993 | Marchant | 369/14 |
| 5,229,834 A | | 7/1993 | Lequime | 356/365 |
| 5,233,444 A | * | 8/1993 | Musha et al. | 369/122 |
| 5,245,491 A | | 9/1993 | Horie et al. | 360/114 |
| 5,278,812 A | * | 1/1994 | Adar et al. | 369/44.23 |
| 5,296,988 A | | 3/1994 | Fujino | 360/110 |
| 5,311,360 A | | 5/1994 | Bloom et al. | 359/572 |
| 5,323,373 A | * | 6/1994 | Horimai | 369/110 |
| 5,325,116 A | | 6/1994 | Sampsell | 346/108 |
| 5,383,048 A | | 1/1995 | Seaver | 359/279 |
| 5,446,574 A | | 8/1995 | Djupsjobacka et al. | 359/181 |
| 5,448,548 A | * | 9/1995 | Taneya et al. | 369/54 |
| 5,477,323 A | | 12/1995 | Andrews et al. | 356/345 |
| 5,483,607 A | | 1/1996 | O'Keefe | 385/11 |
| 5,491,680 A | | 2/1996 | Pauli | 369/112 |
| 5,493,220 A | | 2/1996 | Oliver et al. | 324/209 |
| 5,495,456 A | * | 2/1996 | Oka et al. | 369/13 |
| 5,495,464 A | * | 2/1996 | Fujikawa et al. | 369/90 |
| 5,521,999 A | * | 5/1996 | Chuang et al. | 369/44.23 |
| 5,536,926 A | | 7/1996 | Ikeda et al. | 235/462 |
| 5,625,483 A | | 4/1997 | Swartz | 359/224 |
| 5,633,959 A | | 5/1997 | Niki et al. | 385/11 |
| 5,737,302 A | | 4/1998 | Kasahara | 369/118 |
| 5,742,419 A | | 4/1998 | Dickensheets et al. | 359/201 |

OTHER PUBLICATIONS

M. Daneman, O. Solgaard, N. Tien, K. Lau, R. Muller, "Laser–to–Fiber Coupling Module Using a Micromachined Alignment Mirror", *IEEE* Photonics Technology Letters, vol. 8, No. 3, Mar. 1996, pp. 396–398.

Garvey et al. "Single–mode nonlinear–optical polymer fibers," J. Opt. Soc. Am. B. vol. 13 No. 9 9/96 pp 2017–2023.

3M Corp. "Introduction to Polarization–Maintaining Fibers" 3M Specialty Fiber Sales Publication 78–6900–3455–4 rev. A 1995.

K.S. Lau, Engineering Laboratory Notes insert to Aug. 1996 Issue of Optics and Phototonics News (OPN) "An economical piezoelectric phase modulator for fiber optic sensors".

Barnes et al. "Use of optical fiber heads for optical disks," Applied Optics vol. 25, No. 22 11/86 pp 4010–4012.

Opsasnick et al. "Optical fibers for magneto–optical recording," SPIE vol. 1499 1991 pp 276–280.

Renard et al. "Magneto Optical Reading and Writing Integrated Heads . . . " SPIE vol. 1499 1991 pp 238–247.

Patent Abstracts of Japan Publication No. 01092935.
Patent Abstracts of Japan Publication No. 60047244.
Patent Abstracts of Japan Publication No. 63167439.
Patent Abstracts of Japan Publication No. 61242070.
Patent Abstracts of Japan Publication No. 61265742.
Abstract of European Patent Application Publication No. EP 0 550 095 A3.
Patent Abstracts of Japan Publication No. 04295634.
Patent Abstracts of Japan Publication No. 60154337.
Patent Abstracts of Japan Publication No. 61287056.
Patent Abstracts of Japan Publication No. 08181390.

* cited by examiner

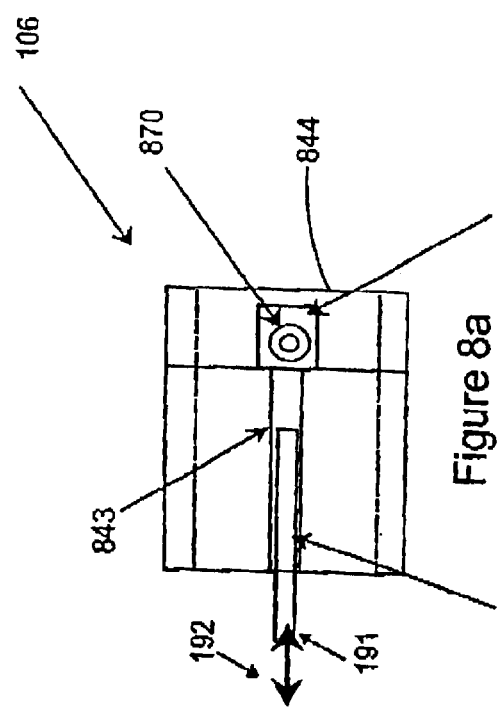
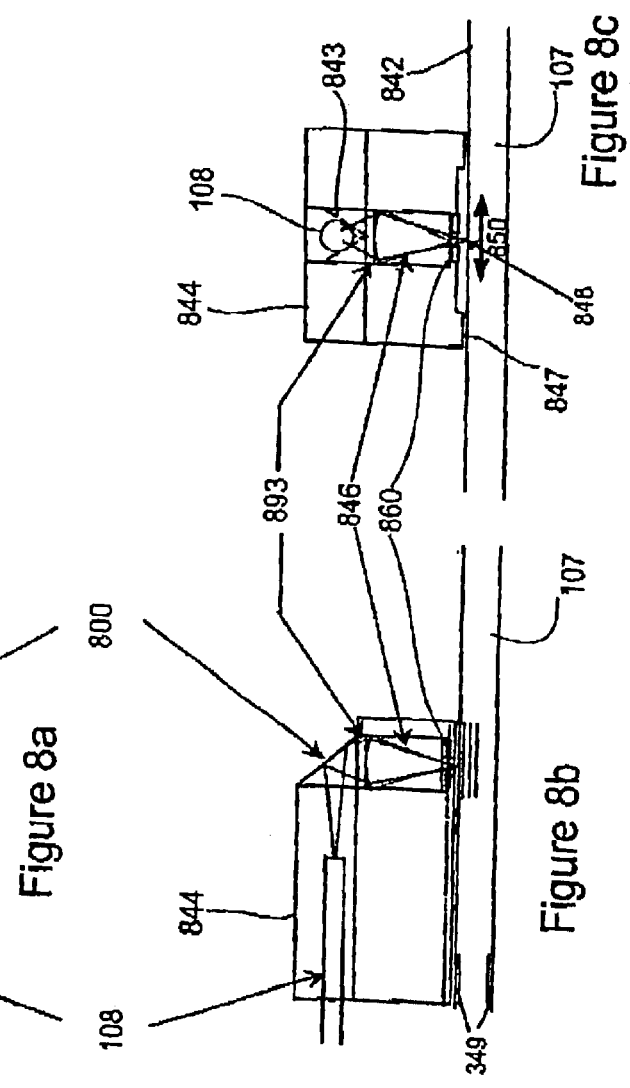

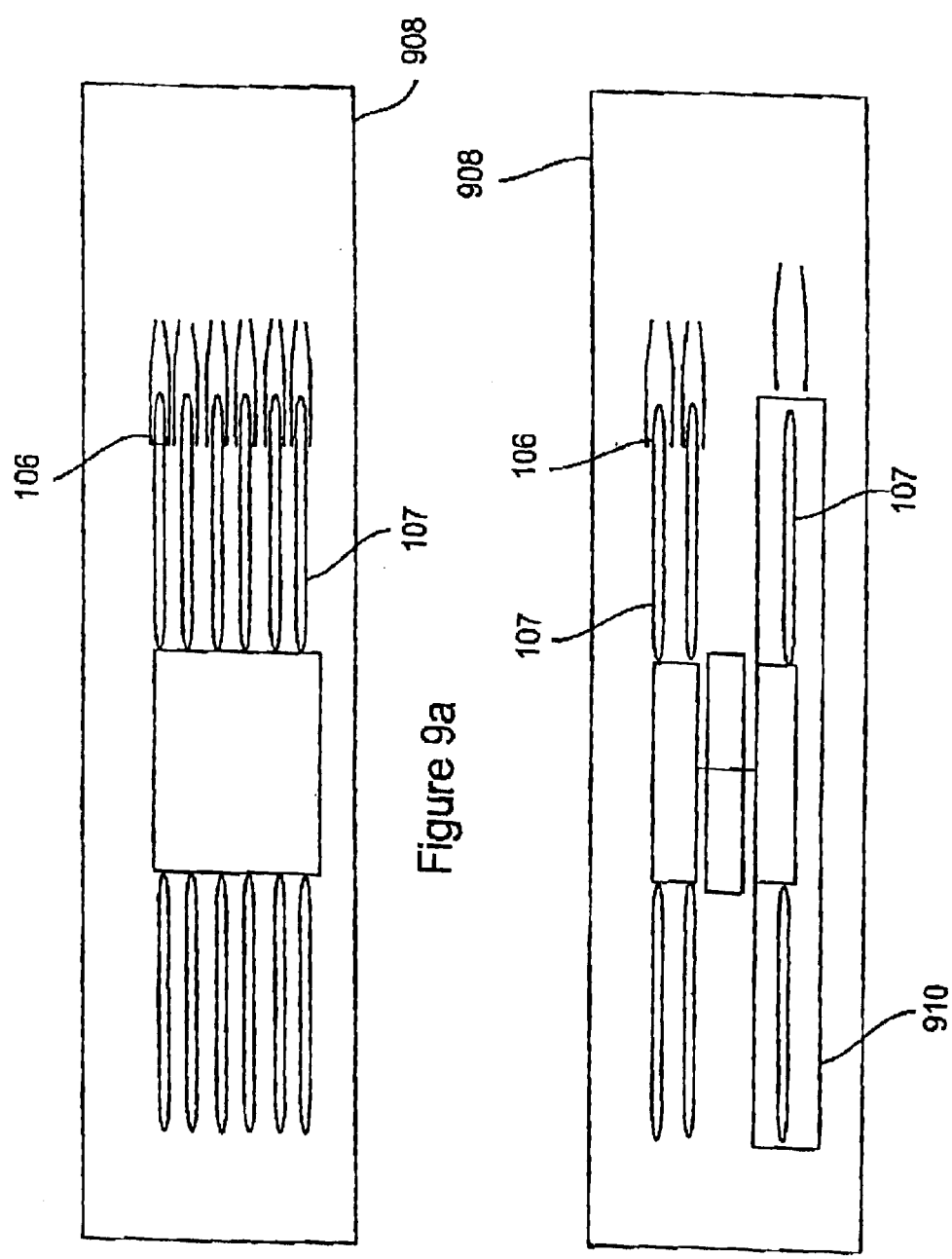

SINGLE FREQUENCY LASER SOURCE FOR OPTICAL DATA STORAGE SYSTEM

CROSS REFERENCE TO RELATED APPLICATIONS

This application is a continuation-in-part and claims benefit of U.S. patent application Ser. No. 08/823,422 abandoned, entitled "Optical Head Using Micro-Machined Elements, filed on Mar. 24, 1997. This application also claims benefit of: Provisional Application Serial No. 60/022,775, entitled "A Data Storage And Retrieval System Based on Flying Magneto-Optical Head," filed on Jul. 30, 1996; Provisional Application Serial No. 60/1023,476, entitled "A Data Storage And Retrieval System Based on A Flying Magneto-Optical Head," filed on Aug. 6, 1996; and Provisional Application Serial No. 60/025,801, entitled "A Data Storage And Retrieval System Based on A Flying Magneto-Optical Head," filed on Aug. 27, 1996. The subject matter of each of these related applications is incorporated herein by reference. All related applications are commonly assigned.

BACKGROUND OF THE INVENTION

1. Field of the Invention

The present invention relates generally to laser sources used in data storage systems. More particularly, the present invention relates to the use of single-frequency laser sources and-optical fibers-in optical data storage systems.

2. Background Art

In a magneto-optical storage system, using a magneto-optical (MO) recording material deposited on a rotating disk, information may be recorded on the disk as spatial variations of magnetic domains. During readout, a magnetic domain pattern modulates an optical polarization, and a detection system converts a resulting signal from optical to electronic format In one type of a magneto-optical storage system, a magneto-optical head assembly Is located on a linear actuator that moves the head along a radial direction of the disk to position the optical head assembly over data tracks during recording and readout A magnetic coil is placed on a separate assembly on the head assembly to create a magnetic field that has a magnetic component in a direction perpendicular to the disk surface. A vertical magnetization of polarity, opposite to that of the surrounding magnetic material of the disk medium is recorded as a mark indicating zero or a one by first focusing a beam of laser light to form an optical spot on the disk. The optical spot functions to heat the magneto-optical material to a temperature near or above a Curie point (a temperature at which the magnetization may be readily altered with an applied magnetic field), A current passed through the magnetic coil orients the spontaneous vertical magnetization either up or down. This orientation process occurs in the region of the optical spot where the temperature is suitably high. The orientation of the magnetization mark is preserved after the laser beam is removed. The mark is erased or overwritten if it is locally reheated to the Curie point by the laser beam during a time the magnetic coil creates a magnetic field in the opposite direction.

Information is read back from a particular mark of interest on the disk by taking advantage of the magnetic Kerr effect so as to detect a Kerr rotation of the optical polarization that is imposed on a reflected beam by the magnetization at the mark of interest. The magnitude of the Kerr rotation Is determined by the material's properties (embodied in the Kerr coefficient). The sense of the rotation is measured by established differential detection schemes and depending on the direction of the spontaneous magnetization at the mark of interest, is oriented clockwise or counterclockwise.

Conventional magneto-optical heads, while presently providing access to magneto-optical disks with areal densities on the order of 1 Gigabit/in$^2$, tend to be based on relatively large optical assemblies which make the physical size and mass of the head rather bulky (typically 3–15 mm in a dimension). Consequently, the speed at which prior art magneto-optical heads are mechanically moved to access new data tracks on a magneto-optical storage disk is slow. Additionally, the physical size of the prior art magneto-optical heads limits the spacing between magneto-optical disks. Because the volume available in standard height disk drives is limited, magneto-optical disk drives have, thus, not been available as high capacity commercial products. For example, a commercial magneto-optical storage device presently available provides access to only one side of a 130 mm double sided 2.6 ISO gigabyte magneto-optical disk, a 40 ms disk access time, and a data transfer rate of 4.6 MB/Sec.

N. Yamada (U.S. Pat. No. 5,255,260) discloses a low-profile flying optical head for accessing an upper and lower surface of a plurality of optical disks. The flying optical head disclosed by Yamada describes an actuating arm that has a static (fixed relative to the arm) mirror or prism mounted thereon, for delivering light to and receiving light from a phase-change optical disk. While the static optics described by Yamada provides access to both surfaces of a plurality of phase-change optical disks contained within a fixed volume, Yamada is limited by the size and mass of the optics. Consequently, the performance and the number of optical disks that can be manufactured to function within a given volume is also limited.

What is needed is an optical data storage system that is compact and that allows an increase in the number of disks that can be placed within a given volume, as compared to the prior art. The improved optical head should preferably provide a high numerical aperture, a reduced head size and mass. Additionally, the optical head should improve upon prior art access to disk surfaces, disk drive access times, data transfer rates, optically induced noise, and ease of alignment and manufacture.

SUMMARY OF THE INVENTION

The present invention provides improvements over prior art optical disk drives. The improvements allow an increase in the number of storage disks that can be placed within any given volume. The improvements include the use of optical fibers to transfer information to and from optical storage media. The optical disk drive further includes a high resonance frequency tracking servo device on a reduced profile head which in conjunction with the optical fibers provides Improved access to storage media, improved disk drive access times, and improved data transfer rates.

The optical disk of the present invention utilizes Winchester magnetic disk technology. A laser optics assembly couples an optical light source through an optical switch to one or more rotary arms, each of which support an optical head for writing and reading data to the storage media. Lighting Is delivered through an optical fiber to a respective optical head for the purpose of probing the storage media with a focused optical spot. The reflected light signal from the storage media couples back through the optical head and optical fiber for subsequent processing.

The optical path of the light delivered by the optical fiber is altered by a steerable micro-machined mirror. Track following and seeks to adjacent tracks are performed by rotating a central mirror portion of the mirror about an axis of rotation. A reflected light from the steerable micro-machined mirror is directed through an embedded micro-objective lens such as a GRIN (Graded Index) lens or a molded lens. A focused optical spot is scanned back and forth in a direction which is approximately parallel to the radial direction of the storage media. In a second preferred embodiment, track following and seeks to adjacent tracks may be performed with more than one storage media at a time by operating a set of steerable micro-machined mirrors independently from each other.

In the preferred embodiment, the information is transferred to and from magneto-optical storage disks using optical fibers that are single-mode polarization maintaining optical fibers. Due to inherent birefringence of single-mode polarization maintaining optical fibers, the present invention identifies that by using single frequency laser source (ie., a distributed feedback (DFB) laser diodes,) a polarization state conveyed by the polarization maintaining optical fibers may be conveyed with significantly reduced noise over that when used with conventional Fabry-Perot diode lasers.

BRIEF DESCRIPTION OF THE DRAWINGS

FIGS. 8a–c are diagrams showing a magneto-optical head in a top view, a side cross-sectional view, and a front cross-sectional view, respectively; and FIG. 9a–b illustrate two embodiments of a magneto-optical data storage and retrieval system as used in a magneto-optical disk drive.

DETAILED DESCRIPTION OF THE INVENTION

Figure 1:
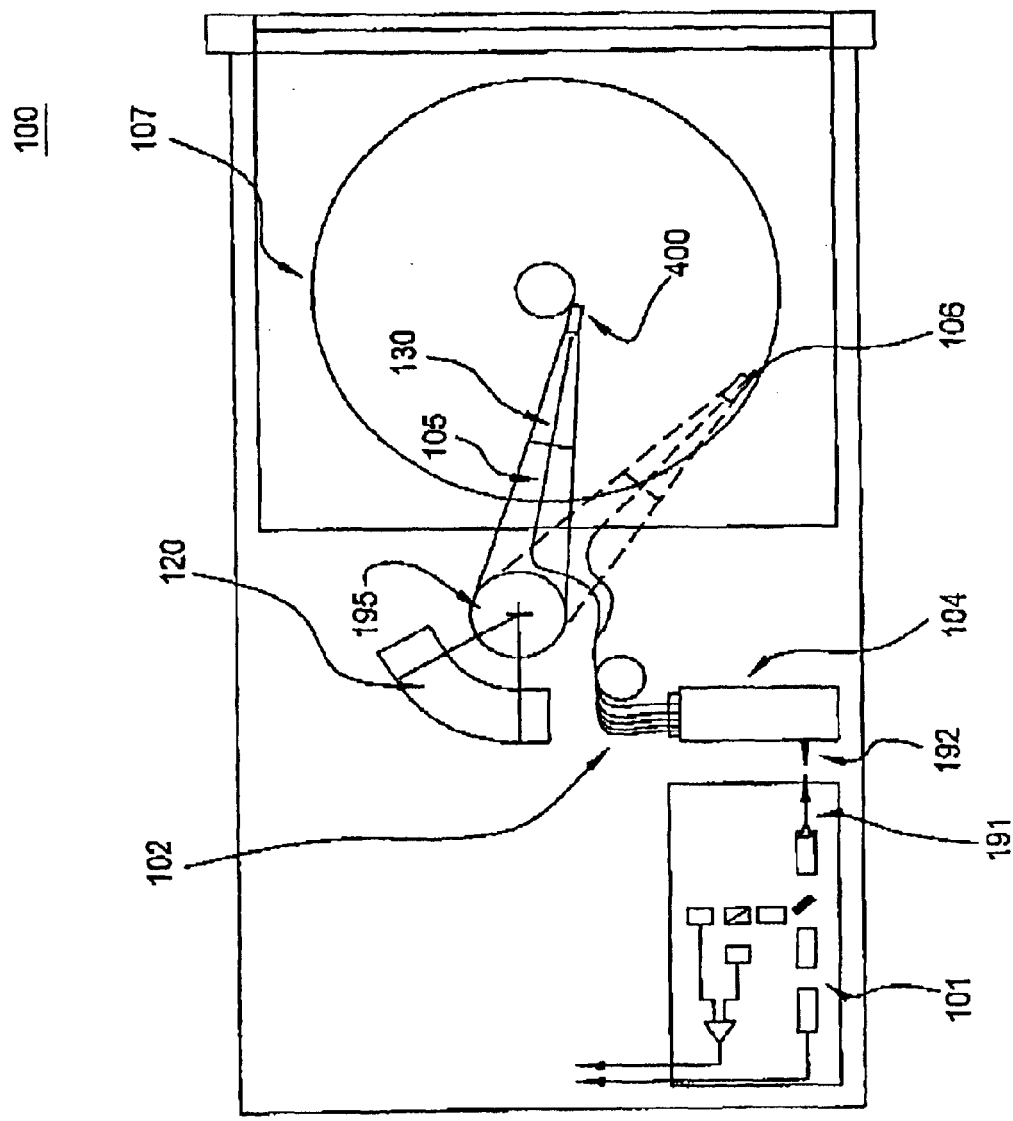
FIG. 1 illustrates a magneto-optical storage and retrieval system, generally illustrated in a top view.

Referring in detail now to the drawings wherein similar parts of the invention are identified by like reference numerals, there is seen in FIG. 1 a magneto-optical storage and retrieval system 100. In a preferred embodiment, the magneto-optical (MO) data storage and retrieval system 100 includes a set of Winchester-type flying heads 106 that are adapted for use with a set of double-sided first surface MO disks 107 (one flying head for each MO disk surface). The set of flying heads 106 (hereinafter referred to as flying MO heads) are coupled to a rotary actuator magnet and coil assembly 120 by a respective suspension 130 and actuator arm 105 so as to be positioned over the surfaces of the set of MO disks 107. In operation, the set of MO disks 107 are rotated by a spindle motor 195 so as to generate aerodynamic lift forces between the set of flying MO heads 106 and so as to maintain the set of flying MO heads 106 in a flying condition approximately 15 micro-inches above the upper and lower surfaces of the set of MO disks 107. The lift forces are opposed by equal and opposite spring forces applied by the set of suspensions 130. During non-operation, the set of flying MO heads 106 are maintained statically in a storage condition away from the surfaces of the set of MO disks 107.

System 100 further includes: a laser-optics assembly 101, an optical switch 104, and a set of single-mode polarization maintaining (PM) optical fibers 102. Each of the set of single-mode PM optical fibers 102 may be respectively coupled through a respective one of the set of actuator arms 105 and set of suspensions 130 to a respective one of the set of flying MO heads 106.

Figure 2:
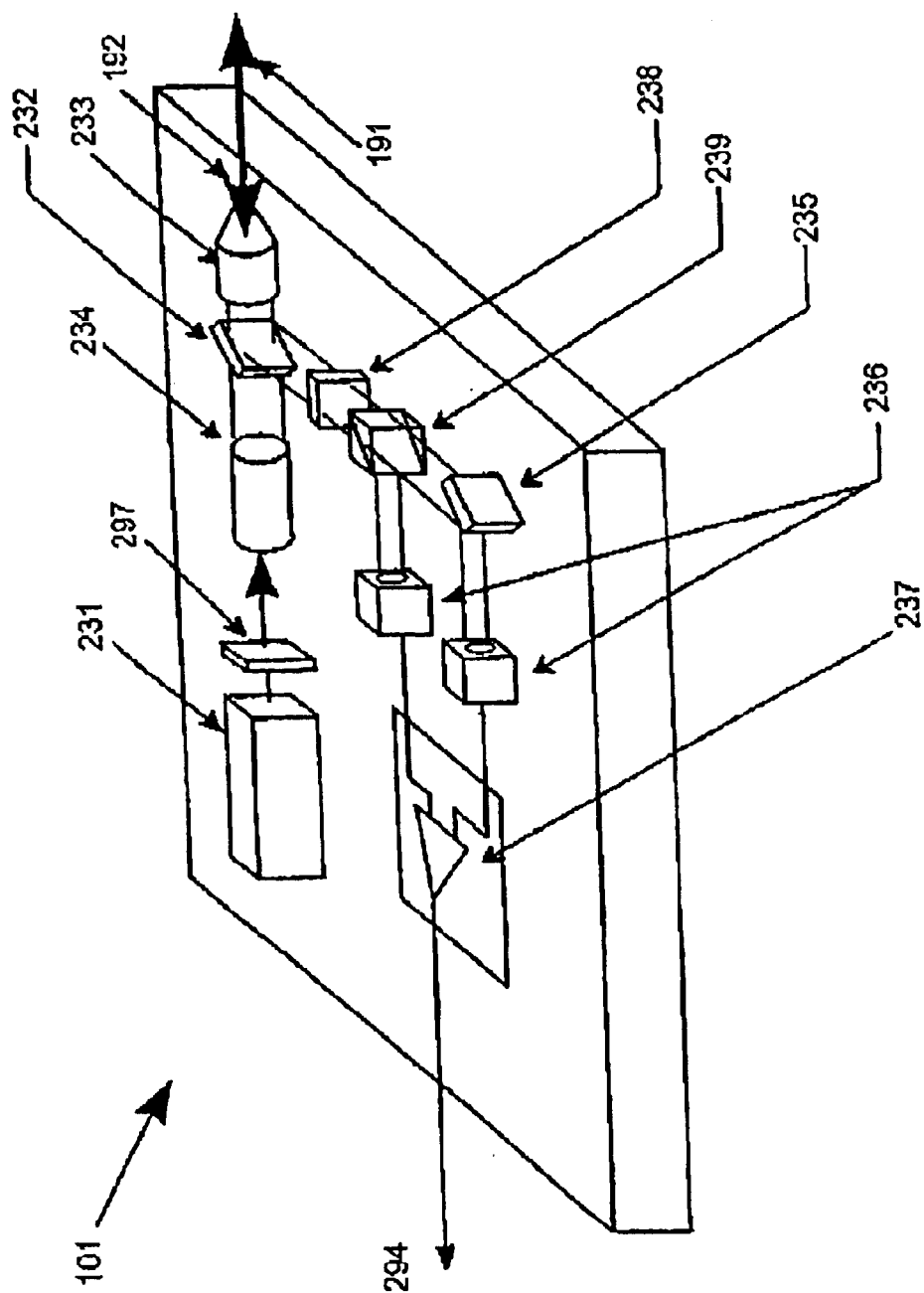
FIG. 2 is a diagram showing one embodiment of the laser-optics assembly of the magneto-optical data storage and retrieval system of FIG. 1.

FIG. 2 is a diagram showing one embodiment of the laser-optics assembly of the magneto-optical data storage and retrieval system of FIG. 1. The laser-optics assembly 101 includes a linearly polarized distributed feedback (DFB) laser source 231. In an exemplary embodiment, the laser source 231 operates at a single wavelength, preferably at 635–685 nm within a red region of the visible light spectrum; however, it is understood that laser sources operating at other wavelengths could also be used. The laser-optics assembly 101 further includes: a collimating optics 234, a low wavelength dispersion leaky beam splitter 232, and a coupling lens 233. The laser-optics assembly 101 directs (from the linearly polarized laser source 231) a linearly polarized outgoing laser beam 191 (shown in FIG. 1) toward the optical switch 104. Laser-optics assembly 101 further includes: a ¼ wave plate 238, a mirror 235, and a polarizing beam splitter 232. A linearly polarized reflected laser beam 192 (shown in FIG. 1 and discussed below) is directed by the optical switch 104 to the coupling lens 233, and is routed by the leaky beam splitter 232 to a differential detector comprising: the ¼ wave plate 238, the mirror 235, and the polarizing beam splitter 239. The laser-optics assembly 101 may further include an optical isolator 297 positioned between the laser source 231 and the collimating lens 234. As is well established in the art, this type of differential detection scheme measures the optical power in two orthogonal polarization components of the reflected laser beam 192, with a differential signal being a sensitive measure of polarization rotation induced by the Kerr effect at the surface of one of the set of MO disks 107. After conversion by a set of photo-diodes 236, the differential signal is processed by the differential amplifier 237 and is output as signal 294.

Figure 3:
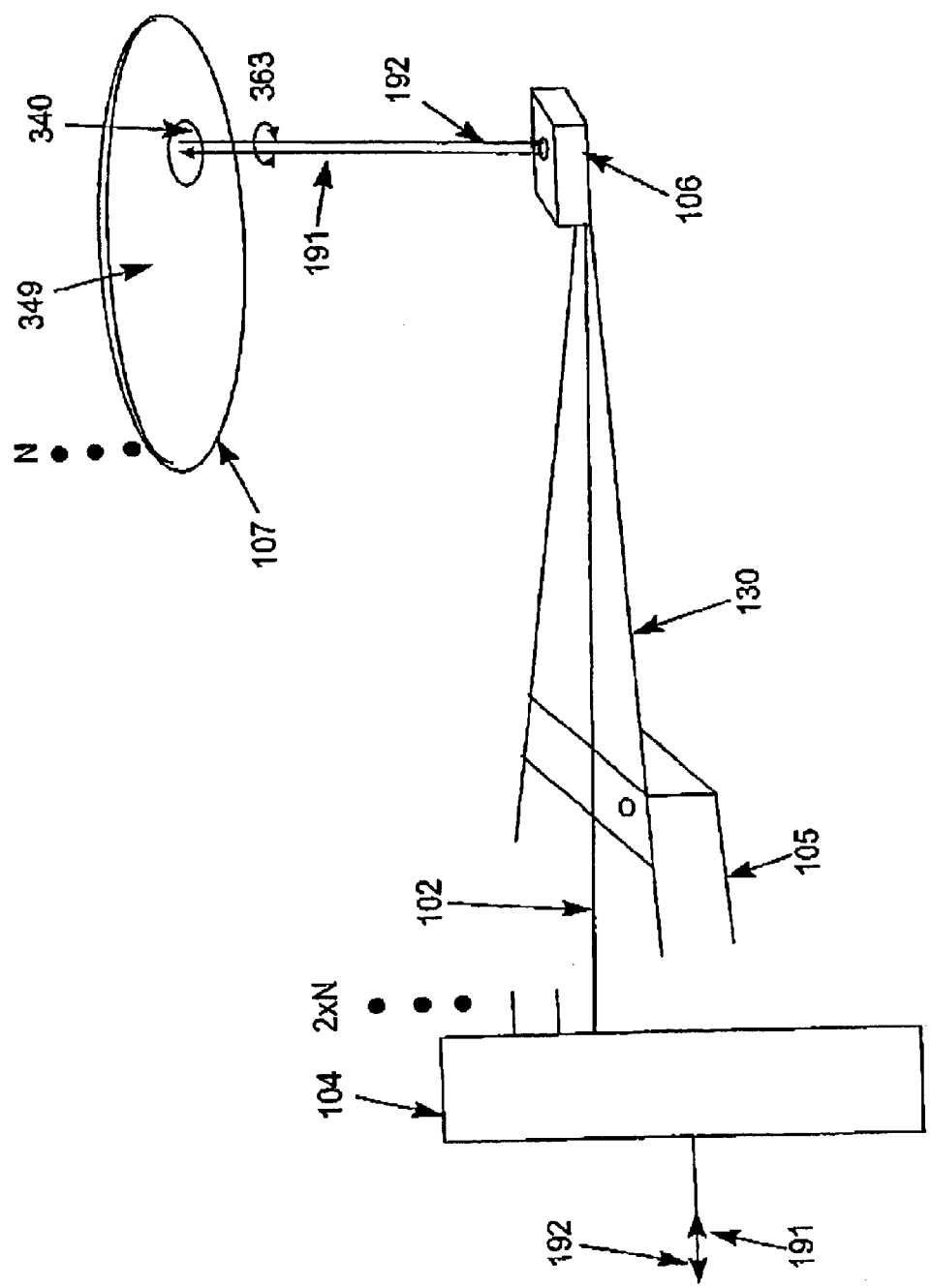
FIG. 3 is a diagram showing a representative optical path.

FIG. 3 is a diagram showing a representative optical path that includes: the optical switch 104, one of the set of single-mode PM optical fibers 102, and one of the set of flying MO heads 106. The optical switch 104 provides degrees of selectivity so as to direct the outgoing laser beam 191 towards a respective proximal end of a respective single-mode PM optical fiber 102. The linearly polarized outgoing laser beam 191 from the laser-optics assembly 101 is preferably aligned in the optical path so as to enter the proximal end of the PM optical fiber 102 at an 45 degree angle relative to a fast axis of the PM optical fiber 102. The outgoing laser beam 191 is further directed by the single-mode PM optical fiber 102 to exit a respective distal end so as to pass through the flying MO head 106 onto a surface recording layer 349 of a respective MO disk 107.

Figure 4B:
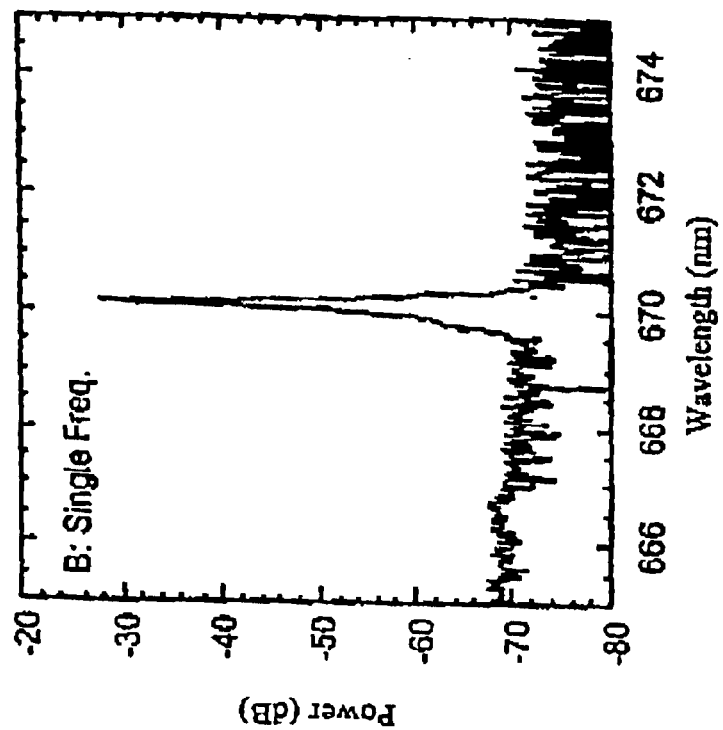
FIGS. 4A and 4B illustrate a comparison of the spectral output of a Fabry-Perot diode laser to that of a frequency-stabilized DFB laser diode source.
Figure 4A:
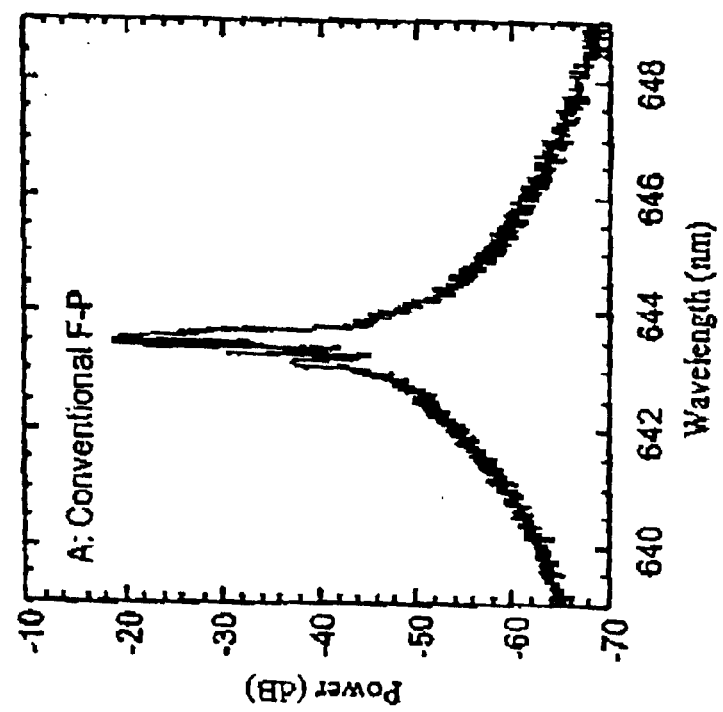

FIGS. 4A and 4B illustrate a comparison of the spectral output of a Fabry-Perot diode laser (FIG. 4A) to the spectral output of a frequency-stabilized DFB laser diode source (FIG. 4B). In the preferred embodiment, the DFB laser source 231 is a distributed feedback (DFB) diode laser source. A DFB laser source 231, unlike an RF-modulated Fabry-Perot diode laser, produces a very narrowband single-frequency output due to the use of a wavelength selective grating element inside the laser cavity. The present invention identifies that when linearly polarized light from a DFB laser source 231 is launched into the single-mode PM optical fiber 102, the light exiting the optical fiber comprises a polarization state that depends on the relative orientation between the fiber axes and the incident polarization, and moreover, the output polarization state is very stable in time as long as external perturbations which alter the fiber birefringence are negligible. This behavior contrasts to that observed when using prior art RF-modulated Fabry-Perot diode laser sources. Fabry-Perot laser diodes are characterized by high-frequency fluctuations in their spectral output; therefore, when linearly polarized light Is launched into a single-mode PM optical fiber 102, fluctuations in the laser wavelength fluctuations lead to corresponding polarization fluctuations in the laser light exiting the output of the optical fiber. The resulting polarization noise is larger than the corresponding DFB diode laser source case owing to wavelength dependent mode coupling. Mode coupling in PM fibers is a phenomenon whereby a small portion of the light that is being guided along one polarization axis is coupled into the orthogonal axis by intrinsic or stress-induced defects. In MO recording it is important that the polarization noise be kept to a minimum, such that an SNR in the range of 20–25 dB can be achieved. Thus, in the present invention, by using a DFB laser source 231 it is possible to achieve the aforementioned level of SNR in the magneto-optical (MO) data storage and retrieval system 100 when utilizing the single-mode PM optical fiber 102 for the delivery and return of polarized light to and from the MO disk 107.

Figure 6:
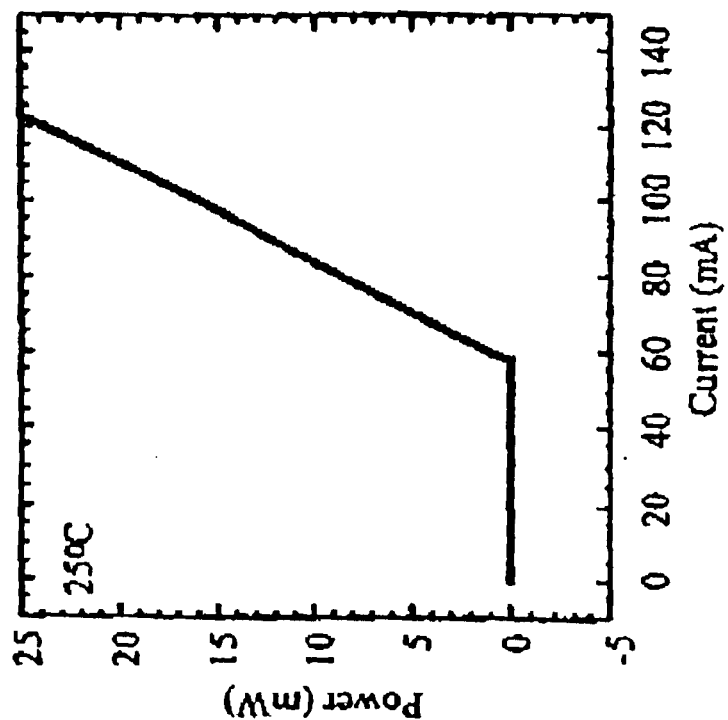
FIGS. 5 and 6 illustrate a representative structure of a DFB diode laser source and exemplary power vs. current characteristics, respectively.
Figure 5:
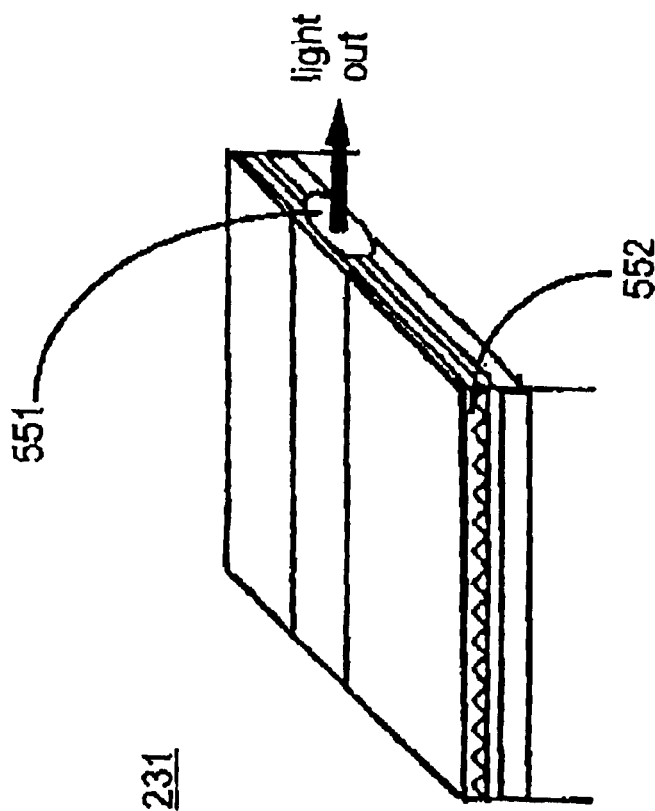

FIGS. 5 and 6 illustrate representative structure of a DFB diode laser source and exemplary power vs. current characteristics, respectively. DFB diode laser sources utilize buried grating layer structures 552 in order to stabilize the laser wavelength. A DFB diode laser's performance degrades as damage occurs to it's facets 551 (only the front facet labeled). In the preferred embodiment, the facets are passivated with a coating to prevent oxygen from reaching the facet. The coating can also be designed to thermally heat-sink the facets, cooling the laser source 231 so as to permit increased laser source output power and thus reduce concomitant damage to the facets. DFB laser diodes as discussed above are developed by SDL Inc., San Jose, Calif.

Figure 7:
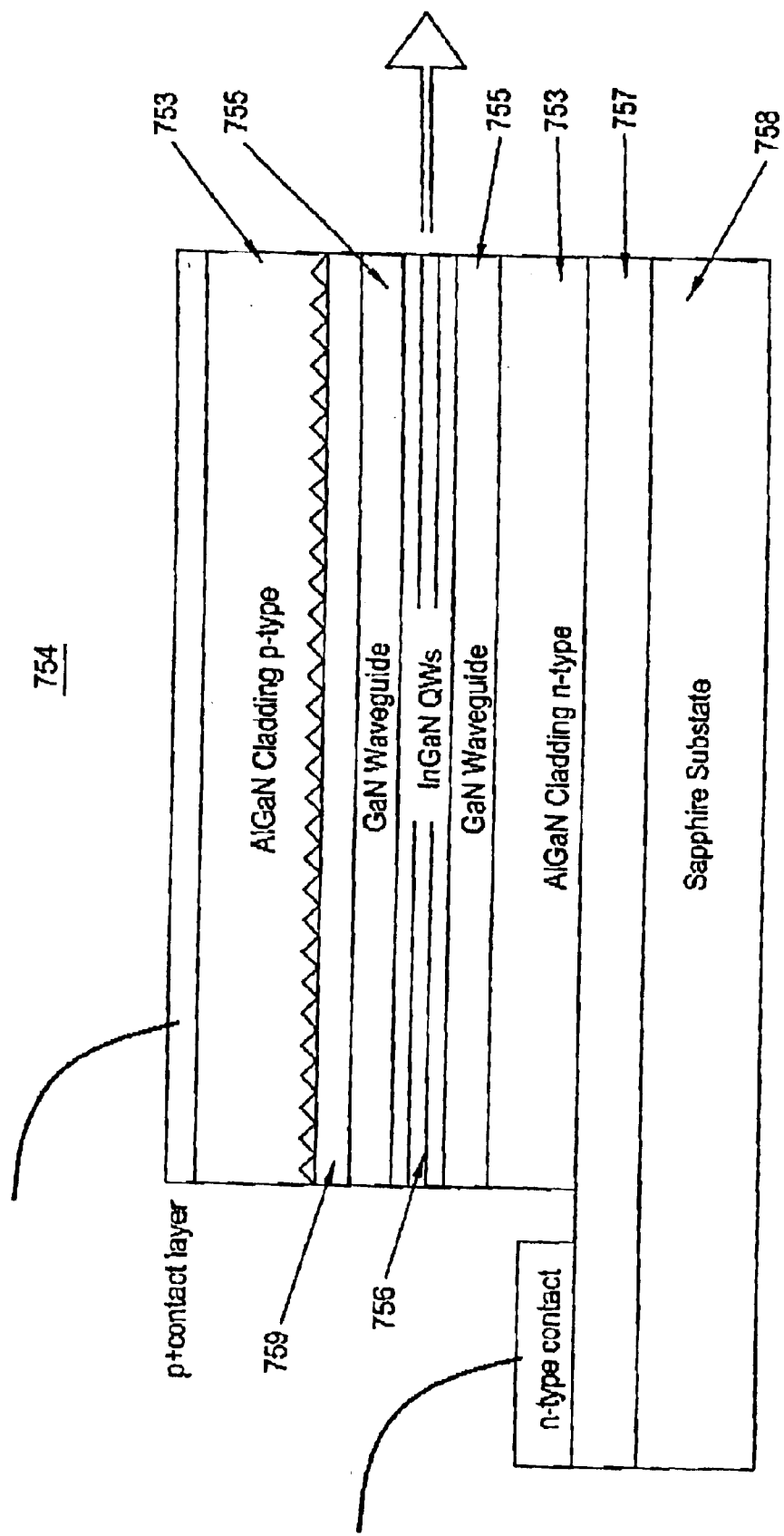
FIG. 7 illustrates a DFB laser source.

FIG. 7 illustrates a DFB laser source 754 proposed to operate as a GaN single-frequency blue diode laser source 754. The active layer of the laser source consists of InGaN wells 756, roughly 50 A thick, sandwiched between thin InGaN layers of low in content. This mule quantum-well structure is bounded by thicker GaN layers 755 to form a separate confinement hetrostucture. The core is itself surrounded by AlGaN cladding layers 753 roughly 0.5 $\mu$m thick. The entire structure is grown on a GaN buffer 757 approximately 3 $\mu$m in thickness, atop a substrate 758 which is typically sapphire, spinel, or SiC. A single-frequency device can be formed by introducing a grating layer 759 which couples the output into a single longitudinal mode. The architecture discussed for single-frequency GaN DFB structures is similar to that of the red laser source 231 described above; however, blue GaN DFB laser diodes require shorter period gratings. It is understood that single frequency properties of diode laser sources such as distributed Bragg reflector (DBR) laser diodes may also being utilized with the single-mode PM optical fibers 102.

Referring back to FIG. 3, during writing of information, the outgoing laser beam 191 is selectively routed by the optical switch 104 to the MO disk 107 so as to lower a coercivity of the surface recording layer 349 by heating a selected spot of interest 340 to approximately the Curie point of the MO recording layer 349. Preferably, the optical intensity of outgoing laser beam 191 is held constant at a power on a range of 30–40 mw, while a time varying vertical bias magnetic field is used to define a pattern of "up" or "down" magnetic domains perpendicular to the MO disk 107. This technique is known as magnetic field modulation (MFM). Alternatively, outgoing laser beam 191 may be modulated in synchronization with the time varying vertical bias magnetic field at the spot of interest 340 in order to better control domain wall locations and reduce domain edge jitter. Subsequently, as the selected spot of interest 340 cools at the surface layer 349, information is encoded at the surface of the respective spinning disk 107.

During readout of information, the outgoing laser beam 191 (at a lower power compared to writing) is selectively routed to the MO disk 107 such that at any given spot of interest 340 the Kerr effect causes (upon reflection of the outgoing laser beam 191 from the surface layer 349) a reflected laser beam 192 to have a rotated polarization of either clockwise or counter clockwise sense 363 that depends on the magnetic domain polarity at the spot of interest 340. The aforementioned optical path is bi-directional in nature. Accordingly, the reflected laser beam 192 is received through the flying MO head 106 and enters the distal end of the single-mode PM optical fiber 102. The reflected laser beam 192 propagates along the single-mode PM optical fiber 102 to exit at its proximal end and is selectively routed by the optical switch 104 for transmission to laser-optics assembly 101 for subsequent optical and electronic conversion.

FIGS. 8-a-c are diagrams showing a magneto-optical head in a top view, a side cross-sectional view, and a front cross-sectional view, respectively. The set of flying MO heads may be illustrated with reference to a single representative flying MO head 106. A single representative flying MO head 106 is shown in FIGS. 8-b-c to be positioned respectively above a surface recording layer 349 of one of the set of spinning MO disks 107. In a preferred embodiment, the flying MO head 106 includes: a slider body 844, an air bearing surface 847, a transmissive quarter-wave plate 893, a steerable micro-machined mirror assembly 800, an objective optics 846, and a magnetic coil 860 in an exemplary embodiment, the magnetic coil 860 is a micro multi-turn coil positioned near the air-bearing surface 847 so as to generate a magnetic field that is: approximately 300 Oersteds of either polarity, reversible in a time of about 4 ns, and approximately perpendicular to the plane of the spinning MO disk 107. Preferably, the magnetic coil should not interfere with the outgoing and reflected laser beams 191 and 192 during passage through the flying MO head 106 to the spinning MO disk 107, or vice versa. As determined by mechanical dimensions and/or optical properties of the aforementioned elements comprising the flying MO head 106, the slider body 844 includes a height of approximately 889 urn and a planar footprint area that corresponds to that of a nano slider (2032 urn×1600 um). In an exemplary embodiment, the quarter-wave plate 893 includes a square dimension of approximately 250 um, a thickness of approximately 89 um, and a phase retardation of about 90 degrees (+/−3 degrees) at a wavelength of interest. Single-mode PM optical fiber 102 is preferably coupled to the flying MO head 106 and is held along an axis of the slider body 844 by a v-groove 843 or other suitably dimensioned channel. The single-mode PM optical fiber 102 is positioned within the v-groove 843 to preferably direct the outgoing laser beam 191 as an optimally focused optical spot 848. The single-mode PM optical fiber 102 may be subsequently secured in place by using an ultraviolet curing epoxy or a similar adhesive. Use of the PM optical fiber 102 within a V-groove permits accurate alignment and delivery of the outgoing laser beam 191 relative to the small mirror assembly 800. The steerable micro-machined mirror assembly 800, the quarter-wave plate 893, and objective optics 846 are preferably compact and low mass so as to fit within a physical volume defined approximately the rectangular outer dimensions of the slider body 844 and yet sufficiently large to direct a full cross section of the outgoing and reflected laser beams 191 and 192 so that minimal power is lost and significant distortion and aberrations in the outgoing and reflected laser beams 191 and 192 are not introduced.

The steerable micro-machined mirror assembly 800 is aligned in the representative optical path so as to direct the outgoing laser beam 191 through the objective optics 846 and quarter-wave plate 893 and so as to direct the reflected laser beam 192 from the MO disk 107 back to the laser optics assembly 101. The objective optics 846 may be a microlens with a numerical aperture (NA) of approximately 0.67. In an exemplary embodiment, at a wavelength of 650 nm, the micro-lens focuses the optical spot 848 with a full width at half-maximum intensity (FWHM) of approximately 0.54 um. The microlens may be a GRIN (Graded Index) lens 846, of simple and compact cylindrical shape. A cylindrical shape permits the lens 846 to be easily inserted into a simple receiving aperture provided in the slider body 844. To minimize spherical aberration and achieve diffraction-limited focusing, the GRIN lens 846 may be polished to assume a plano-convex shape, with the convex surface being a simple spherical shape. The desired thickness and radius of curvature of the GRIN lens 846 is a function of a number of factors including: the magnitude of the refractive index gradient, the wavelength of light, the numerical aperture of the PM optical fiber 102, and the desired focused optical spot 848 size. In an exemplary embodiment, the GRIN lens 846 height is approximately 350 um, the radius of curvature is approximately 200 um, and the lens diameter is approximately 250 um. The optimum focus occurs on the planar side of the GRIN lens 846 and preferably comprises a depth of focus that Is approximately 25 micro-inches. Because flying height of the air bearing surface 847 is preferably maintained at a value to be approximately 15 micro-inches, a focusing servo is not necessarily required.

The single-mode PM optical fiber 102 functions as an aperture of a confocal optical system that has a large depth resolution along its optical axis and an improved transverse resolution. The improved transverse resolution improves the detection of smaller magnetic domain orientations as well as detection of magnetic domain edges as compared to a nonconfocal system. The large depth resolution minimizes cross-talk between closely spaced surface recording levels when using multi-level storage media. Another advantage that arises from the confocal nature of the present invention is that stray light reflected from the objective optics 846 is filtered.

As used in the magneto-optical storage and retrieval system 100, fine tracking and short seeks to nearby tracks are performed by rotating a reflective central mirror portion of the steerable micro-machined mirror assembly 800 about a rotation axis so that the propagation angle of the outgoing laser beam 191 is changed before transmission to the objective optics 846. A suitable micro-machined mirror assembly is disclosed in commonly assigned U.S. patent application Ser. No. 08/823,422, entitled "Optical Head Using Micro-Machined Elements, filed on 24 Mar. 1997. The reflective central mirror portion is rotated by applying a differential voltage to drive electrodes. The differential voltage creates an electrostatic force that rotates the reflective central minor portion about an axis and enables the focused optical spot 848 to be moved in the radial direction 850 on the MO media 107. In an exemplary embodiment, the central mirror portion rotates approximately +/–2 degrees, which is equivalent to approximately +/–4 tracks at the surface of the MO disk 107. Although, in the exemplary embodiment a movement of +1–4 tracks is disclosed, depending on the desired performance characteristics of the steerable micro-machined mirror 800 described above, a range of movement greater or fewer than +/–4 tracks is understood to also be possible. Consequently, movement of the focused optical spot 848 across the MO disk 107 and detection of the reflected laser beam 192 may be used in storage and retrieval of information, track following, and seeks from one data track to another data track. Coarse tracking may be maintained by adjusting a current to rotary actuator magnet and coil assembly 120 (FIG. 1). The track following signals used to follow a particular track of the MO disk 107 may be derived using combined coarse and fine tracking servo techniques that are well known in the art. For example, a sampled sector servo format may be used to define tracks. The servo format may include either embossed pits stamped into the MO disk 107 or magnetic domain orientations that are read similar to data marks. If embossed pits are used, an adder output circuit may be used to supplement the differential output circuit 237 (FIG. 2). Those skilled id the art will recognize that conventional prior art multiple magnetic disk Winchester magnetic disk drives use a set of respective suspensions and actuator arms that move in tandem as one integral unit. Therefore, because each flying head of such an integral unit is fixed relative to another flying head, during track following of a particular magnetic disk surface, simultaneous track following of another magnetic disk surface is not possible. In contrast, irrespective of the movement of the set of actuator arms 105 and set of suspensions 130, a set of steerable micro-machined mirror assemblies 800 may be used to operate independently and thus permit track following and seeks so as to read and/or write information using more than one MO disk surface at any given time. Independent track following and seeks using a set of concurrently operating steerable micro-machined assemblies 800 preferably requires a set of separate respective read channel and fine track electronics and mirror driving electronics. Because the aforementioned embodiment would also preferably require use of separate laser-optics assemblies 101, an optical switch 104 for switching between each of the separate optical paths in and not necessarily be required.

FIG. 9a is a diagram showing a magneto-optical data storage and retrieval system as part of a magneto-optical disk drive. In a preferred embodiment, the magneto-optical system 100 comprises a compact high-speed and high-capacity MO disk drive 908 that includes an industry standard 5.25 inch half-height form factor (1.625 inch), at least six double-sided MO disks 107, and at least twelve flying MO heads 106. As discussed above, the flying MO heads 106 may be manufactured to include PM optical fibers 102 as part of a very small mass and low profile high NA optical system so as to enable utilization of multiple MO disks 107 at a very dose spacing within the MO disk drive 908 and; therefore, to comprise a higher areal and volumetric and storage capacity than is permitted in art equivalent volume of the prior art in the preferred embodiment, a spacing between each of the at least six MO disks 107 can be reduced to at least 0.182 inches. The present invention identifies that by using a single frequency laser source such as distributed feedback (DFB) laser diode 231, a polarization state conveyed by the PM optical fibers 102 may be conveyed with significantly reduced noise over that when used with conventional Fabry-Perot diode lasers.

In an alternative embodiment shown in FIG. 9b, the half-height form factor MO disk drive 908 may include a removable MO disk cartridge portion 910 and two fixed internal MO disks 107. By providing the removable MO disk cartridge portion 910, the fixed internal and removable combination permits external information to be efficiently delivered to the MO disk drive 908 for subsequent transfer to the internal MO disks 107. The copied information may, subsequently, be recorded back onto the removable MO disk cartridge portion 910 for distribution to other computer systems. In addition, the removable MO disk cartridge portion 910 allows for very convenient and high speed back-up storage of the internal MO spinning disks 107. The fixed internal and removable combination also permits storage of data files on the removable MO disk cartridge portion 910 and system files and software applications on the internal MO spinning disks 107. In another alternative embodiment (not shown) an MO disk drive 908 may include: any number (including zero) of internal MO disks 107 and/or any number of MO disks 107 within any number of removable MO disk cartridge portions.

The present invention does not necessarily require use of rotary actuator arms, for example, linear actuator arms may be used. The low profile optical paths disclosed by the present invention may be used to convey information to and from a storage location without requiring objective optics (e.g., using a tapered optical fiber or an optical fiber with a lens formed on an end); and/or reflective substrates (e.g., using a curved optical fiber to convey information along surfaces of the magneto-optical head 106).

It is understood that the present invention can find utility in a variety of environments. Therefore, although the present invention has been described herein with reference to particular embodiments thereof, a latitude of modification, various changes and substitutions are intended in the foregoing disclosure, and it will be appreciated that in some instances some features of the invention will be employed without a corresponding use of other features without departure from the scope of the invention as set forth.

We claim:

1. An optical data storage system, including:
   a single frequency diode laser operating at one stable frequency; and
   at least one polarization maintaining optical fiber; said at least one polarization maintaining optical fiber used to direct light from said single frequency diode laser to a storage media.

2. The optical data storage system as recited in claim 1, wherein said single frequency diode laser comprises a distributed feedback laser diode.

3. The optical data storage system as recited in claim 1, wherein said single frequency diode laser comprises a distributed Bragg reflector diode laser.

4. The optical data storage system as recited in claim 1, further comprising: at least one magneto-optical head.

5. The optical data storage system as recited in claim 4, wherein at least one of said polarization maintaining optical fibers is coupled to a respective at least one of said magneto-optical heads.

6. The optical data storage system as recited in claim 1, further comprising a reflective steerable portion, wherein said steerable portion alters an optical path of said light from said single frequency diode laser.

7. The optical data storage system as recited in claim 2, wherein said single frequency diode laser operates between a wavelength of 635 and 685 nanometers.

8. An assembly for use in a magneto-optical data storage system, comprising:
   a single frequency diode laser source operating at one stable frequency; and
   a polarization maintaining optical fiber coupled to the single frequency diode laser wherein the polarization maintaining optical fiber directs light from the single frequency diode laser to a storage media.

9. The assembly as recited in claim 8, wherein said single frequency diode laser source comprises a distributed feedback diode laser source.

10. The assembly as recited in claim 8, wherein said single frequency diode laser source comprises a distributed Bragg reflector diode laser source.

11. The assembly as recited in claim 8, wherein light reflected from the storage media is conveyed by said polarization maintaining optical fiber to a detector.

12. A method of using light in an optical data storage system comprising the steps of:
   providing light from a single frequency diode laser source at one stable frequency; and
   directing said light between said single frequency diode laser source and a storage destination using a polarization maintaining optical fiber.

13. The method as recited in claim 12, wherein said single frequency diode laser source comprises a distributed frequency laser diode source.

14. The method as recited in claim 13, wherein said single frequency diode laser source comprises a distributed Bragg reflector laser source.

* * * * *